United States Patent
Gebuhr et al.

(10) Patent No.: US 9,406,853 B2
(45) Date of Patent: Aug. 2, 2016

(54) METHOD FOR MANUFACTURING AT LEAST ONE OPTOELECTRONIC SEMICONDUCTOR DEVICE

(75) Inventors: Tobias Gebuhr, Regensburg (DE); Hans-Christoph Gallmeier, Regensburg (DE); Herbert Brunner, Sinzing (DE); Kirstin Petersen, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 225 days.

(21) Appl. No.: 13/982,225

(22) PCT Filed: Dec. 21, 2011

(86) PCT No.: PCT/EP2011/073646
§ 371 (c)(1),
(2), (4) Date: Oct. 7, 2013

(87) PCT Pub. No.: WO2012/110147
PCT Pub. Date: Aug. 23, 2012

(65) Prior Publication Data
US 2014/0034983 A1    Feb. 6, 2014

(30) Foreign Application Priority Data
Feb. 14, 2011  (DE) .......................... 10 2011 011 139

(51) Int. Cl.
| | |
|---|---|
| *H01L 33/38* | (2010.01) |
| *H01L 33/46* | (2010.01) |
| *H01L 33/50* | (2010.01) |
| *H01L 33/60* | (2010.01) |
| *H01L 33/54* | (2010.01) |

(Continued)

(52) U.S. Cl.
CPC ............... *H01L 33/60* (2013.01); *H01L 33/50* (2013.01); *H01L 33/54* (2013.01); *H01L 33/56* (2013.01); *H01L 33/62* (2013.01); *H01L 2224/24* (2013.01); *H01L 2933/005* (2013.01); *H01L 2933/0066* (2013.01)

(58) Field of Classification Search
None
See application file for complete search history.

(56) References Cited

U.S. PATENT DOCUMENTS

| | | | |
|---|---|---|---|
| 7,230,188 B1 * | 6/2007 | En et al. ........................ | 174/257 |
| 7,525,248 B1 | 4/2009 | Fan | |

(Continued)

FOREIGN PATENT DOCUMENTS

| | | |
|---|---|---|
| CN | 1977394 A | 6/2007 |
| CN | 101933166 A | 12/2010 |

(Continued)

*Primary Examiner* — Robert Bachner
*Assistant Examiner* — Molly Reida
(74) *Attorney, Agent, or Firm* — Slater Matsil, LLP

(57) ABSTRACT

A method for manufacturing at least one optoelectronic semiconductor device includes providing a substrate and applying a number of optoelectronic semiconductor chips, which are arranged spaced apart from one another in a lateral direction, on an upper face of the substrate. At least one reflective coating is applied to the exposed areas of the substrate and the lateral surfaces of the optoelectronic semiconductor chips. Openings are introduced into the reflective coating, which completely penetrate the reflective coating. Electrically conductive material is arranged on the reflective coating and at least on some parts of the openings. Radiation penetration surfaces of the optoelectronic semiconductor chips are free of the reflective coating and the reflective coating does not laterally extend beyond the optoelectronic semiconductor chips.

13 Claims, 3 Drawing Sheets

(51) Int. Cl.
  *H01L 33/56* (2010.01)
  *H01L 33/62* (2010.01)

(56) References Cited

U.S. PATENT DOCUMENTS

| | | |
|---|---|---|
| 8,723,192 B2 | 5/2014 | Weidner et al. |
| 2008/0218072 A1 | 9/2008 | Haruna et al. |
| 2008/0278061 A1 | 11/2008 | De Samber et al. |
| 2009/0121241 A1 | 5/2009 | Keller et al. |
| 2009/0236619 A1* | 9/2009 | Chakroborty ............. 257/89 |
| 2010/0019254 A1 | 1/2010 | Nagai et al. |
| 2012/0119233 A1* | 5/2012 | Weidner et al. ............. 257/88 |

FOREIGN PATENT DOCUMENTS

| | | |
|---|---|---|
| DE | 102009025015 A1 | 2/2010 |
| DE | 102008045653 A1 | 3/2010 |
| DE | 102009036621 A1 | 2/2011 |
| JP | 2013501368 A | 1/2013 |
| WO | 2011015449 A1 | 2/2011 |

* cited by examiner

METHOD FOR MANUFACTURING AT LEAST ONE OPTOELECTRONIC SEMICONDUCTOR DEVICE

This patent application is a national phase filing under section 371 of PCT/EP2011/073646, filed Dec. 21, 2011, which claims the priority of German patent application 10 2011 011 139.5, filed Feb. 14, 2011, each of which is incorporated herein by reference in its entirety.

TECHNICAL FIELD

A method for manufacturing at least one optoelectronic semiconductor device and an optoelectronic semiconductor device are specified.

SUMMARY OF THE INVENTION

A method for manufacturing an optoelectronic semiconductor device is achieved, in a cost-effective manner. It is possible to manufacture an optoelectronic semiconductor device in which radiation losses are avoided and which is compact and simple in terms of construction.

In accordance with at least one embodiment of the method, a first step involves providing a carrier, which has a top side and an underside situated opposite the top side of the carrier. The carrier can be a board (e.g., a circuit board), for example, which is formed with an electrically insulating material, such as a plastic or a ceramic material, for example. It is likewise conceivable for the carrier to be embodied in a flexible fashion and, for example, as a film.

An area formed by a part of the outer area of the carrier is respectively formed at the top side and the underside. The area at the underside is the part of the outer areas of the carrier which faces a contact carrier—for example, a circuit board—in the mounted state of the carrier.

By way of example, the area at the underside of the carrier is a mounting area that can serve for mounting the later semiconductor device on the contact carrier. Furthermore, the carrier has a plurality of connection areas arranged at the top side alongside one another in a lateral direction. In this context, in a "lateral direction" means in the direction parallel to the main extension direction of the carrier. "Alongside one another" means, for example, that the connection locations can be arranged in a manner spaced apart from one another in a lateral direction.

In accordance with at least one embodiment of the method, a next step involves applying a plurality of optoelectronic semiconductor chips at the top side of the carrier, said chips being arranged in a manner spaced apart from one another in a lateral direction. The optoelectronic semiconductor chips each have at least one contact area facing away from the carrier. By way of example, interspaces between the individual optoelectronic devices are present in a lateral direction. In a plan view of the carrier, the interspaces are delimited by side areas of two optoelectronic devices respectively adjacent to one another and the area facing the semiconductor chips at the top side of the carrier. The at least one contact area serves for making electrical contact with the optoelectronic semiconductor chip and is formed with an electrically conductive material, for example a metal. Preferably, a connection area of the carrier is assigned uniquely or one-to-one to each contact area of an optoelectronic semiconductor chip. By way of example, the connection areas and the optoelectronic semiconductor chips are arranged alongside one another in a lateral direction. By way of example, an optoelectronic semiconductor chip is electrically conductively connected by an outer area facing away from the contact area to a contact location of the carrier by soldering, bonding or adhesive bonding.

The optoelectronic semiconductor chip can be a luminescence diode chip. The luminescence diode chip can be a light-emitting or laser diode chip that emits radiation in the range from ultraviolet to infrared light. Preferably, the luminescence diode chip emits light in the visible or ultraviolet range of the spectrum of the electromagnetic radiation.

In accordance with at least one embodiment of the method, a next step involves applying at least one reflective coating to exposed locations of the carrier and side areas of the optoelectronic semiconductor chips. "Reflective" means, in particular, that the reflective coating is reflective at least to the extent of 90%, preferably to the extent of more than 95%, to electromagnetic radiation which impinges on it and is generated by the semiconductor chip during operation. By way of example, the reflective coating appears white to an external observer. By way of example, radiation-reflecting particles are introduced into the reflective coating, said particles, for example, being formed with at least one of the materials $TiO_2$, $BaSO_4$, $ZnO$, $Al_2O_3$, $ZrO_2$ or containing one of the materials mentioned. The side areas of the optoelectronic semiconductor chip delimit the respective semiconductor chip in a lateral direction. By way of example, the side areas run transversely with respect to the main extension direction of the carrier and/or of the semiconductor chip. Preferably, neither a gap nor an interruption is formed between the reflective coating, on the one hand, and the side areas of the optoelectronic semiconductor chip and the exposed locations of the carrier, on the other hand.

In accordance with at least one embodiment of the method, a next step involves introducing openings into the reflective coating, which completely penetrate through the reflective coating and extend from a top side of the reflective coating facing away from the carrier in the direction of the top side of the carrier. Preferably, a contact area and an opening assigned to the contact area overlap at least in places in a vertical direction. The "vertical direction" is a direction transverse or perpendicular with respect to the main extension direction of the carrier. By way of example, the openings have at least one side area, a bottom area and a top area situated opposite the bottom area, wherein the side area connects the bottom area and the top area to one another. The at least one side area of the opening is formed by the reflective coating at least in places, wherein the bottom area is formed by a contact area at least in places.

In accordance with at least one embodiment of the method, a next step involves arranging electrically conductive material on the reflective coating and at least in places in the openings, wherein the electrically conductive material in each case electrically conductively connects a contact area to the connection area assigned thereto. That is to say that the electrically conductive material in each case electrically conductively connects an optoelectronic semiconductor chip to a connection area of the carrier assigned to the semiconductor chip and in this case runs between the optoelectronic semiconductor chip and the connection area at least in places at a top side of the reflective coating facing away from the carrier. In this case, the electrically conductive material can be arranged in places directly on an outer area of the reflective coating. By way of example, the electrically conductive material is formed with a metal or an electrically conductive adhesive. Preferably, an electrically conductive connection between the optoelectronic semiconductor chip and a connection area of the carrier assigned to the optoelectronic semiconductor chip is formed completely by the electrically conductive material. The openings can be completely or partly filled with the electrically conductive material.

In accordance with at least one embodiment of the method, the radiation passage areas of the optoelectronic semiconductor chips are free of the reflective coating. In this case, the radiation passage area of the semiconductor chip is a main area of the semiconductor chip facing away from the carrier. "Free" means that the radiation passage areas are neither covered by the reflective coating nor is the reflective coating disposed downstream of the semiconductor chip along, for example, a radiation exit path of the optoelectronic semiconductor chip. The radiation can therefore emerge from the optoelectronic semiconductor chip without being obstructed. It is at most possible for material residues of the reflective coating still to be situated on the radiation passage areas in a manner governed by the manufacturing process, but said residues cover at most 10%, in particular at most 5%, of the radiation passage areas.

By means of the reflective coating described here, an emission geometry of the later optoelectronic semiconductor device can be set for example depending on the degree of coverage of the side areas by the reflective coating. If the side areas are covered completely by the reflective coating, for example, a side emission of electromagnetic radiation generated within the optoelectronic semiconductor chips can be minimized or even entirely prevented. In this case, a side emission of electromagnetic radiation can be blocked. In particular, an undesirable blue emission and/or shift of the emitted electromagnetic radiation (referred to as blue piping) can thus be avoided.

In accordance with at least one embodiment, the reflective coating does not project laterally beyond the optoelectronic semiconductor chips. It is conceivable for the reflective coating to terminate flush with the radiation passage areas of the optoelectronic semiconductor chips in a vertical direction. The reflective coating then completely coats the side areas of the optoelectronic semiconductor chips, for example, as a result of which the radiation portion reflected back into the converter element by the reflective coating is as large as possible. The electromagnetic radiation generated in the semiconductor chip can therefore leave the semiconductor device, apart from possible absorption effects of the coating, only at the locations provided for this purpose, that is to say can leave the optoelectronic semiconductor chips exclusively through the radiation passage areas. Therefore, the reflective coating contributes to a particularly effective reduction of radiation losses and an associated increase in a radiation efficiency of the later optoelectronic semiconductor device. In this context, "radiation efficiency" means the ratio between the useable luminous energy respectively coupled out from the semiconductor device and the luminous energy primarily generated within the optoelectronic semiconductor chips.

In accordance with at least one embodiment of the method, a first step involves providing a carrier, which has a top side, an underside situated opposite the top side of the carrier, and a plurality of connection areas arranged at the top side alongside one another in a lateral direction. A next step involves applying a plurality of optoelectronic semiconductor chips at the top side of the carrier, said chips being arranged in a manner spaced apart from one another in a lateral direction and each having at least one contact area facing away from the carrier. A next step involves applying at least one reflective coating to exposed locations of the carrier and side areas of the optoelectronic semiconductor chips. Furthermore, a next step involves introducing openings into the reflective coating, which completely penetrate through the reflective coating and extend from a top side of the reflective coating facing away from the carrier in the direction of the top side of the carrier. A next step involves arranging electrically conductive material on the reflective coating and at least in places in the openings where the electrically conductive material in each case electrically conductively connects a contact area to the connection area assigned thereto. In this case, radiation passage areas of the optoelectronic semiconductor chips are free of the reflective coating, and the reflective coating does not project laterally beyond the optoelectronic semiconductor chips.

In this case, the method for manufacturing an optoelectronic semiconductor device as described here is based on the insight, inter alia, that the manufacture of an optoelectronic semiconductor device in which radiation losses are intended to be particularly low may often be associated with high costs. By way of example, radiation losses can be reduced by means of reflective optics fitted laterally with respect to the optoelectronic semiconductor chips. The reflective optics can reflect the electromagnetic radiation emitted by the optoelectronic semiconductor chips in a direction away from the optoelectronic semiconductor chips, as a result of which a radiation efficiency of the semiconductor device can be increased. However, such reflective optics may be associated with considerable additional costs in the process for manufacturing the optoelectronic semiconductor device. Furthermore, such reflective optics may lead to devices which are not very compact and simple in terms of construction.

In order, then, to specify a method in which, in a cost-effective manner, it is possible to manufacture an optoelectronic semiconductor device in which radiation losses are minimized and which is compact and simple in terms of construction, the method described here makes use of the concept, inter alia, of applying a reflective coating to exposed locations of a carrier of the optoelectronic semiconductor device and side areas of the optoelectronic semiconductor chips, wherein radiation passage areas of the optoelectronic semiconductor chips are free of the reflective coating and the reflective coating does not project laterally beyond the optoelectronic semiconductor chips.

By means of the reflective coating, the electromagnetic radiation which is generated within the optoelectronic semiconductor chips and which partly emerges through side areas of the semiconductor chip is reflected back into the semiconductor chip and, for example, in a direction away from the semiconductor chips and the carrier. Advantageously, the highest possible proportion of the electromagnetic radiation generated in the optoelectronic semiconductor chip is thus coupled out from the later semiconductor device. In other words, the reflective coating replaces the reflective optics discussed above. That is to say that, in the case of the present method, it is possible to dispense with arranging reflective optics. Furthermore, such an arrangement of the reflective coating leads to a semiconductor device which is particularly small in terms of its vertical extent.

In accordance with at least one embodiment, the reflective coating is a potting applied by a potting process. By way of example, the reflective coating is formed with a reflective ceramic. By way of example, the reflective coating is applied to exposed locations of the carrier and of the side areas of the optoelectronic semiconductor chips by means of potting and subsequent curing. Such a potting can lead to a mechanical stabilization of the carrier. The carrier is advantageously protected against cracks or fatigue fractures during the further method.

In accordance with at least one embodiment of the method, the electrically conductive material only partly fills at least one of the openings, wherein at least one electrically insulating filling material is arranged at least in places in the opening onto exposed locations of the electrically conductive material. By way of example, the electrically conductive material covers the at least one side area of the opening and the bottom area of the opening with a predeterminable layer thickness. In this case, "layer thickness" is the maximum extent of the electrically conductive layer in each case in a direction transverse with respect to the side area and/or the bottom area of the opening. That spatial content of the opening which is not filled by the electrically conductive material and is delimited by the reflective coating in a lateral direction can subsequently be filled at least partly with at least one electrically insulating filling material.

In accordance with at least one embodiment of the method, the electrically insulating filling material does not project laterally beyond the optoelectronic semiconductor chips and/or the reflective coating. That can mean that the electrically insulating filling material terminates flush with the reflective coating in a vertical direction, such that the openings are filled up to the level of an outer area of the reflective coating facing away from the carrier. In this case, after arranging the electrically insulating filling material, the electrically insulating filling material does not protrude from the optoelectronic semiconductor device and is not raised above the reflective coating. In this case, an outer area of the electrically insulating material facing away from the carrier can be completely congruent with the top areas of each of the openings both in a lateral direction and in a vertical direction. That is to say that the top areas of the openings terminate the electrically insulating filling material in a vertical direction at least in places.

In accordance with at least one embodiment, the electrically insulating filling material is formed with a silicone, an epoxide and/or a mixture composed of a silicone and an epoxide. The mixture can be a hybrid material. It has been found that a filling material formed with such materials can be processed particularly well in the manufacturing process and can, for example, mechanically stabilize the later optoelectronic semiconductor device. Likewise, the filling material described here leads to the lowest possible radiation absorption losses within the later semiconductor device, such that the highest possible proportion of electromagnetic radiation primarily generated within the optoelectronic semiconductor chips can couple out from the semiconductor device.

In accordance with at least one embodiment of the method, after arranging the electrically conductive material at least in places onto at least one radiation passage area and at least in places onto exposed locations of the electrically conductive material, at least one conversion layer is applied, wherein the conversion layer contains at least one luminescence conversion material. In this case, the side areas of the conversion layer are free of the reflective coating. The luminescence conversion material serves for at least partly converting electromagnetic radiation primarily generated within the optoelectronic semiconductor chips into electromagnetic radiation having a different wavelength. By way of example, after arranging the electrically insulating filling material, the conversion layer is additionally applied at least in places to the electrically conductive material and/or the electrically insulating filling material. That is to say, after arranging the conversion layer, the latter can additionally cover the electrically insulating filling material at least in places. In this context, it is conceivable for the conversion layer to completely cover the radiation passage areas and the electrically conductive material and also the electrically insulating filling material. In other words, the conversion layer is applied over the whole area in this case. In association with this, color locus differences and/or inhomogeneities along a luminous area of the later semiconductor device are reduced or avoided, since the conversion layer is distributed homogeneously over the entire semiconductor device.

In accordance with at least one embodiment of the method, a basic material of the conversion layer, into which basic material the luminescence conversion material is introduced, and the electrically insulating filling material are formed with the same material. The basic material and/or the filling material can be a matrix and/or hybrid material. "Same material" can mean that the basic material and the filling material are identical in terms of their material composition. In other words, the material properties for example with regard to a thermal expansion, for example depending on a degree of filling of the filling material in the openings, and/or adhesion properties of the basic material and of the filling material can be matched to one another to the greatest possible extent. The electrically insulating filling material can therefore act as an adhesion promoter between the reflective coating and/or the electrically conductive material, on the one hand, and the conversion layer, on the other hand. In other words, the filling material can constitute a connecting element or a binding element between the electrically conductive material and the conversion layer. Detachment of the conversion layer, for example during the operation of the later semiconductor device can thus advantageously be avoided.

In accordance with at least one embodiment of the method, the conversion layer is applied by means of spray coating, electrophoresis, sedimentation or potting. In the case of spray coating, the material of the conversion layer is sprayed onto the relevant locations in a spraying phase, for example by means of a sprayer. By way of example, electrophoresis is a method in which a voltage is applied between a surface, on the one hand, that is to say, for example, the radiation passage areas and/or a surface of the electrically conductive material, and a counterelectrode, as a result of which the conversion layer material, which is in solution, moves toward the surface and deposits at said surface. By way of example, the surface is electrically conductive. In other words, electrophoresis can be an electrophoretic deposition (also EPD) method.

If the conversion layer is applied by means of sedimentation, by way of example, the conversion layer material, contained in a liquid carrier material, deposits onto the desired surfaces, wherein the deposition takes place before the curing of the carrier material. In other words, sedimentation involves a deposition of the material of the conversion layer in a manner driven by weight force. It has been recognized that application by means of sedimentation can lead to a thin and compact conversion layer.

Furthermore, an optoelectronic semiconductor device is specified.

By way of example, the optoelectronic semiconductor device can be produced by means of the method described here, such as has been described in conjunction with one or more of the embodiments mentioned above. That is to say that the features explained for the method described here are also disclosed for the optoelectronic semiconductor device described here.

In accordance with at least one embodiment, the optoelectronic semiconductor device comprises a carrier, which has a top side, an underside situated opposite the top side of the carrier, and at least one connection area arranged at the top side. In addition, the semiconductor device comprises at least one optoelectronic semiconductor chip arranged at the top side of the carrier and having at least one contact area facing away from the carrier. Furthermore, the semiconductor device comprises at least one reflective coating applied to exposed locations of the carrier and of the optoelectronic semiconductor chip, and at least one opening which is arranged above the connection area, completely penetrates through the reflective coating and extends from a top side of the reflective coating facing away from the carrier in the direction of the top side of the carrier. Electrically conductive material arranged on the reflective coating and at least in places in the opening electrically conductively connects the contact area to the connection area. A radiation passage area of the optoelectronic semiconductor chip is free of the reflective coating, wherein the reflective coating does not project laterally beyond the optoelectronic semiconductor chip.

All further exemplary embodiments and features of the optoelectronic semiconductor device are disclosed by means of the method described here and the features thereof.

BRIEF DESCRIPTION OF THE DRAWINGS

The method described here and an optoelectronic semiconductor device described here are explained in greater detail below on the basis of exemplary embodiments and the associated figures.

In the exemplary embodiments and figures, identical or identically acting component parts are in each case provided with the same reference signs. The elements illustrated should not be regarded as true to scale; rather, individual elements may be illustrated with an exaggerated size in order to afford a better understanding.

DETAILED DESCRIPTION OF ILLUSTRATIVE EMBODIMENTS

Figure 1A:
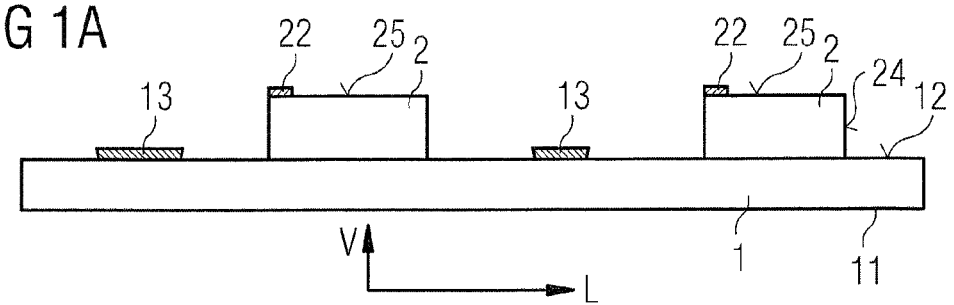
FIGS. 1A, 1B, 1C, 1D, 1E, 2, 3, 4A, 4B and 5 show individual production steps for manufacturing various exemplary embodiments by means of a method described herein.

FIG. 1A shows, in a schematic side view, a first step, which involves firstly providing a carrier 1, which has a top side 12 and an underside 11 situated opposite the top side 12 of the carrier 1. Furthermore, the carrier 1 has a plurality of connection areas 13 arranged at the top side 12 alongside one another in a lateral direction L. Optoelectronic semiconductor chips 2 are arranged on the carrier 1. Each of the optoelectronic semiconductor chips 2 has a contact area 22 facing away from the carrier 1. In this case, the optoelectronic semiconductor chips 2 are arranged in a manner spaced apart from one another in a lateral direction L. The optoelectronic semiconductor chips 2 can be radiation-emitting semiconductor chips that emit ultraviolet radiation or visible light.

By way of example, the carrier has plated-through holes (not shown) that at least partly form the connection areas 13, wherein the plated-through holes extend completely through the carrier 1 in a manner proceeding from the top side 12 of the carrier 1 in the direction of the underside 11 of the carrier 1.

Figure 1B:
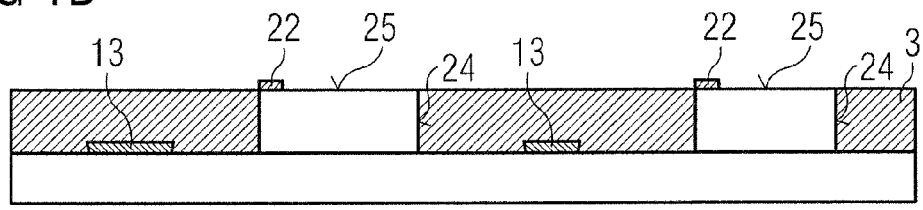

FIG. 1B shows, in a schematic side view, how, in a next step, a reflective coating 3 is applied to exposed locations of the carrier 1 and side areas 24 of the optoelectronic semiconductor chips. In particular, the application process can be effected by means of a process of potting. In this case, the reflective coating is a potting.

In this case, radiation passage areas 25 of the optoelectronic semiconductor chips 2 are free of the reflective coating, wherein the reflective coating 3 does not project laterally beyond the optoelectronic semiconductor chips 2. In other words, the reflective coating 3 terminates flush with the radiation passage areas 25 of the optoelectronic semiconductor chips 2 in a vertical direction V.

Figure 1C:
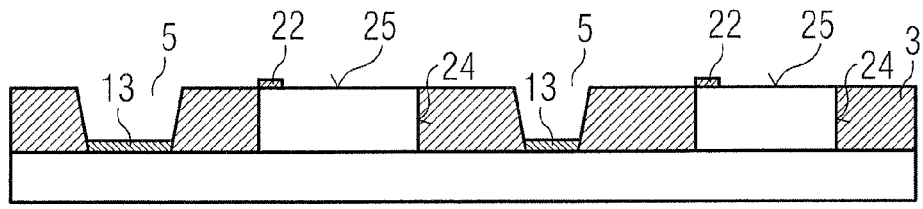

FIG. 1C shows, in a schematic side view, how, in a next step, openings 5 are introduced into the reflective coating 3, which completely penetrate through the reflective coating 3 and extend from a top side 31 of the reflective coating 3 facing away from the carrier 1 in the direction of the top side 12 of the carrier 1.

Figure 1D:
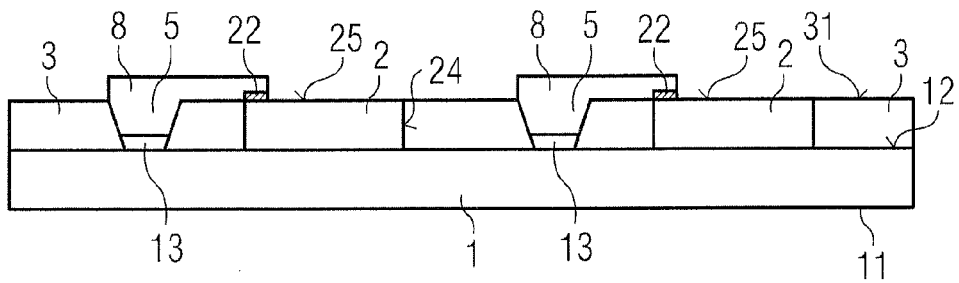

The schematic side view in FIG. 1D shows how, in a next step, electrically conductive material 8 is arranged on the reflective coating 3 and completely in the openings 5. Here the electrically conductive material 8 in each case electrically conductively connects a contact area 22 to the connection area 13 assigned thereto. In the present case, the openings 5 are of conical design, as a result of which they can be filled with the electrically conductive material in a particularly simple manner. By way of example, the electrically conductive material 8 is applied by means of sputtering and/or jetting. After filling into the openings 5, the electrically conductive material 8 is in direct contact with the respective contact areas 22 of the optoelectronic semiconductor chips 2 and the connection areas 13.

Figure 1E:
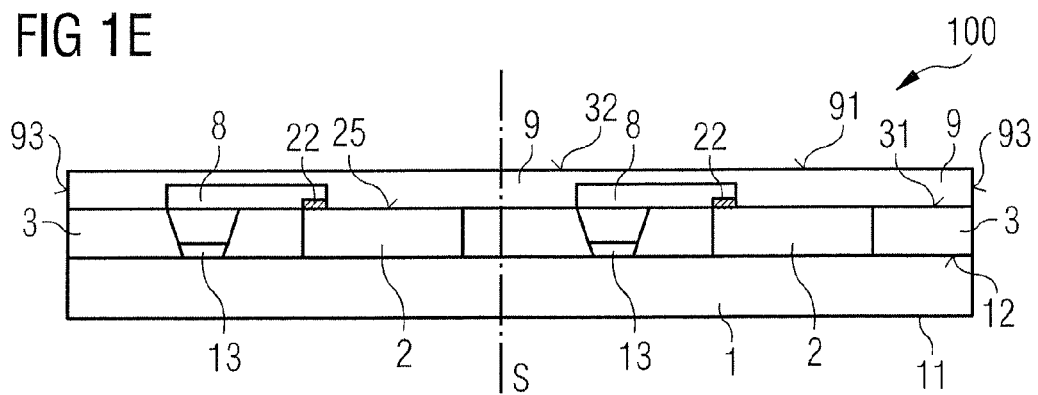

The schematic side view in FIG. 1E shows how, in a next step, after arranging the electrically conductive material 8, a conversion layer 9 is applied to the radiation passage areas 25, exposed locations of the electrically conductive material 8 and exposed locations of the reflective coating 3. In particular, the conversion layer 9 can be applied by means of spray coating and/or potting. In this case, the conversion layer 9 completely covers the radiation passage areas 25, the exposed locations of the electrically conductive material 8 and an outer area 32 of the reflective coating 3 facing away from the carrier 1. That is to say that an outer area of the conversion layer 9 facing away from the carrier 1 is formed in a continuous and uninterrupted fashion and extends over the entire extent of the carrier 1 and/or of the reflective coating 3. The conversion layer 9 contains at least one luminescence conversion material 91, wherein side areas 93 of the conversion layer 9 are free of the reflective coating 3.

Moreover, after the conversion layer 9 has been applied, an optoelectronic semiconductor device 100 described here has been manufactured. By way of example, the exemplary embodiment of an optoelectronic semiconductor device 100 as illustrated in FIG. 1E is an LED panel, which may be suitable in particular for backlighting for installation in flat screens or video projection screens.

It is likewise conceivable for optoelectronic semiconductor devices 100 to be manufactured only after singulation along separating lines S, wherein the separating lines S run in a vertical direction V between optoelectronic semiconductor chips 2 that are respectively adjacent in a lateral direction L.

Figure 2:
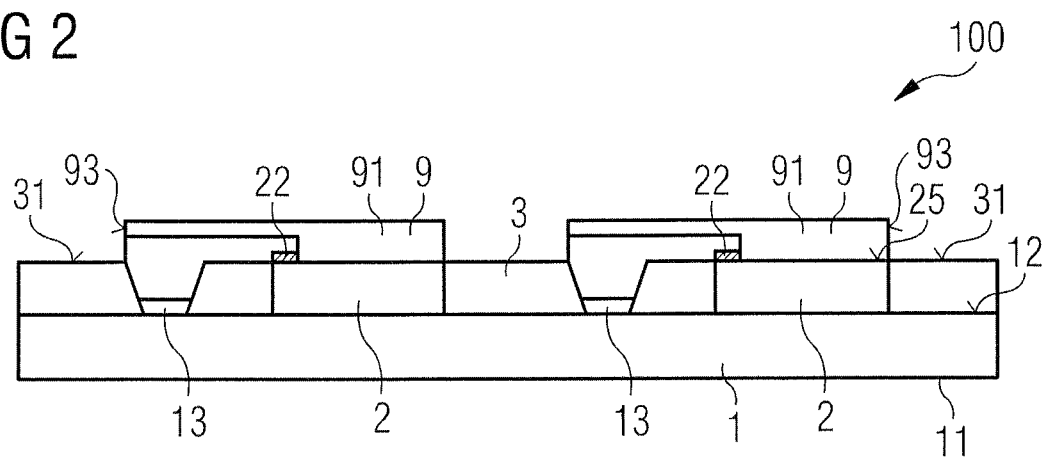

FIG. 2 shows, in a schematic side view, an alternative method for applying the conversion layer 9, wherein the conversion layer 9 is applied by means of electrophoresis instead of by means of the spray coating and/or potting shown in FIG. 1E. It can furthermore be discerned from FIG. 2 that, in contrast to FIG. 1E, the conversion layer 9 now only covers the radiation passage areas 25 and exposed locations of the electrically conductive material 8. In other words, the outer area of the reflective coating 3 facing away from the carrier 1 is free of the conversion layer 9 at least in places or is covered thereby at most with a small layer thickness.

Figure 3:
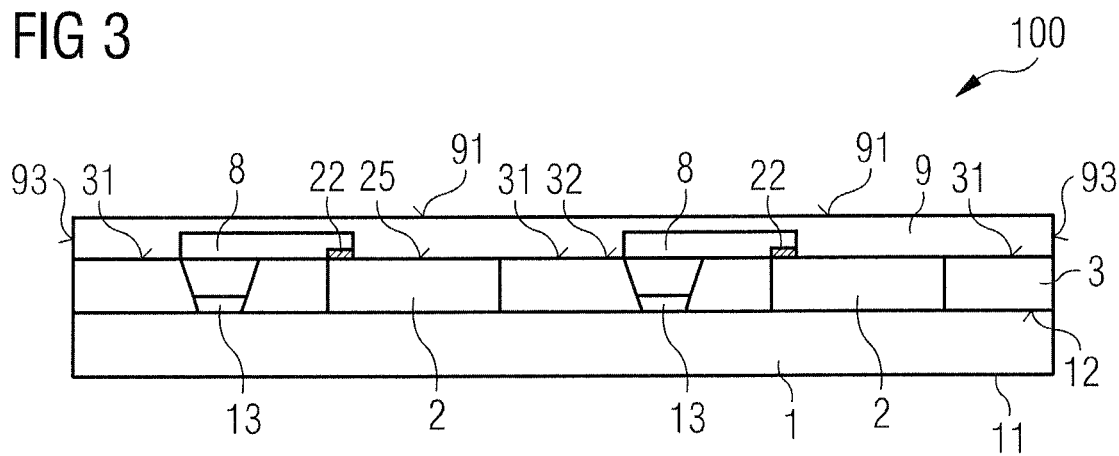

FIG. 3 shows, in a schematic side view, a further alternative method for applying the conversion layer 9, wherein the conversion layer 9 is applied by means of sedimentation instead of the application methods shown in FIG. 1E and FIG. 2 and, in the present exemplary embodiment, completely covers the radiation passage areas 25 and the outer area 32 of the reflective coating 3 facing away from the carrier 1.

Figure 4A:
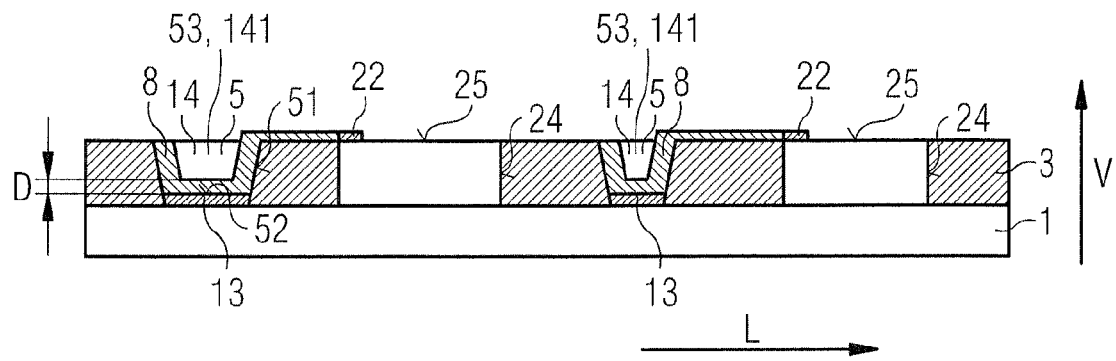

FIG. 4A shows, in a schematic side view, in contrast to FIG. 1D, that the electrically conductive material 8 only partly fills the openings 5. The electrically conductive material 8 can cover side areas 51 and a bottom area 52 of each opening 5 with a predeterminable maximum layer thickness D. In particular, the maximum layer thickness D can be at most 20 μm. That spatial content within each opening 5 which is not filled by the electrically conductive material 8 and is delimited by the reflective coating 3 in a lateral direction L is completely filled with an electrically insulating filling material 14. In particular, the filling material 14 can be a silicone, an epoxide or a mixture composed of silicone and epoxide. By way of example, the mixture is a hybrid material. In particular, the radiation-reflecting particles described here can be introduced into the filling material. In this case, the electrically insulating filling material 14 does not project laterally beyond the optoelectronic semiconductor chips 2 and the reflective coating 3. In the present case, an outer area 141 of the electrically insulating material 14 facing away from the carrier 1 is completely congruent with a top area 53 of each opening 5 both in a lateral direction L and in a vertical direction V. The top area 53 therefore terminates the electrically insulating filling material 14 in a vertical direction V.

Figure 4B:
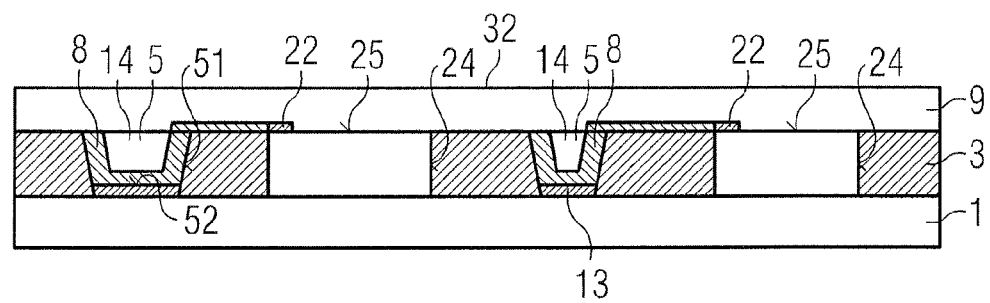

The schematic side view in FIG. 4B shows how, in a next step, after arranging the electrically insulating filling material 14 (see FIG. 4A), the conversion layer 9 is arranged onto exposed locations of the electrically conductive material 8, the outer area 32 of the reflective coating 3 facing away from the carrier 1, the contact areas 22, the radiation passage areas 25 and the outer areas 141 of the electrically insulating material 14. By way of example, the conversion layer 9 is applied by means of the application methods shown in connection with FIG. 1E, 2 or 3. In other words, the conversion layer 9 and the electrically insulating filling material 14 are in direct contact with one another in the region of the openings 5.

In particular, a basic material 92 of the conversion layer 9, into which basic material the luminescence conversion material 9 is introduced, and the electrically insulating filling material 14 can be formed with the same material.

Figure 5:
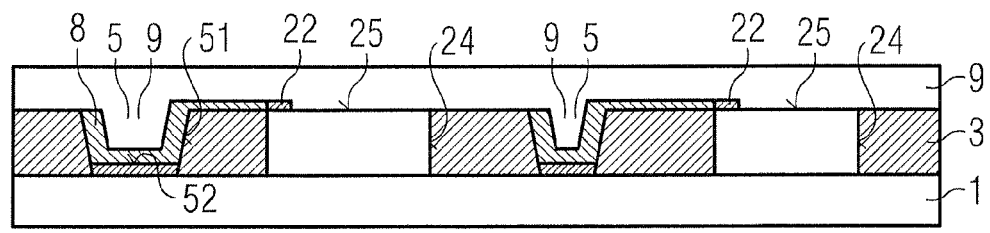

In the schematic side view in FIG. 5, in contrast to FIGS. 4A and 4B, the arrangement of the electrically insulating filling material 14 is dispensed with. Instead, the conversion layer 9 is likewise arranged at least in places in the openings 5. That is to say that the conversion layer 9, after curing, is anchored in the openings 5. Detachment of the conversion layer 9, for example in a lateral direction L, is thus avoided. Furthermore, it is possible to achieve shorter process and production times than described for example in connection with FIGS. 1A to 4B, since, for example, no electrically insulating filling material needs to be arranged.

The invention is not restricted by the description on the basis of the exemplary embodiments. Rather, the invention encompasses any novel feature and also any combination of features, which in particular includes any combination of features in the patent claims, even if this feature or this combination itself is not explicitly specified in the patent claims or the exemplary embodiments.

The invention claimed is:

1. A method for manufacturing an optoelectronic semiconductor device, the method comprising:
   providing a carrier, which has a top side, an underside situated opposite the top side of the carrier and a plurality of electrically conductive connection areas arranged at the top side alongside one another in a lateral direction;
   next applying a plurality of optoelectronic semiconductor chips at the top side of the carrier, the chips being arranged in a manner spaced apart from one another in the lateral direction and each having a contact area facing away from the carrier;
   next applying a reflective coating to exposed locations of the carrier and side areas of the optoelectronic semiconductor chips;
   next introducing openings into the reflective coating, the opening completely penetrating through the reflective coating and extending from a top side of the reflective coating facing away from the carrier in the direction of the top side of the carrier; and
   next arranging electrically conductive material on the reflective coating and at least in places in the openings;
   wherein the electrically conductive material in each case electrically conductively connects the contact area to the connection area assigned thereto;
   wherein radiation passage areas of the optoelectronic semiconductor chips are free of the reflective coating;
   wherein the reflective coating does not project vertically beyond the optoelectronic semiconductor chips;
   wherein in the openings the electrically conductive material is in direct contact with the connection areas;
   wherein in each case the electrically conductive material covers at least a part of the contact area and is in direct contact with the contact area; and
   wherein the electrically conductive material in each case is a contiguous layer formed from one single piece.

2. The method according to claim 1, wherein the reflective coating comprises a potting applied by a potting process.

3. The method according to claim 1, wherein the electrically conductive material only partly fills at least one of the openings, and wherein an electrically insulating filling material is arranged in the opening onto exposed locations of the electrically conductive material.

4. The method according to claim 3, wherein the electrically insulating filling material does not project vertically beyond the optoelectronic semiconductor chips and/or the reflective coating.

5. The method according to claim 3, wherein the electrically insulating filling material is formed with a silicone, an epoxide and/or a mixture composed of a silicone and an epoxide.

6. The method according to claim 3,
   wherein after arranging the electrically conductive material at least in places onto at least one radiation passage area and at least in places onto exposed locations of the electrically conductive material, at least one conversion layer is applied,
   wherein the conversion layer contains at least one luminescence conversion material, and
   wherein side areas of the conversion layer are free of the reflective coating.

7. The method according to claim 6, wherein a basic material of the conversion layer, into which basic material the luminescence conversion material is introduced, and the electrically insulating filling material are formed with the same material.

8. The method according to claim 6, wherein the conversion layer is applied by spray coating, electrophoresis, sedimentation or potting.

9. The method according to claim 1,
   wherein after arranging the electrically conductive material at least in places onto at least one radiation passage area and at least in places onto exposed locations of the electrically conductive material, at least one conversion layer is applied, wherein the conversion layer contains at least one luminescence conversion material, and wherein side areas of the conversion layer are free of the reflective coating.

10. An optoelectronic semiconductor device, comprising:

a carrier, which has a top side, an underside situated opposite the top side of the carrier, and at least one connection area arranged at the top side;

an optoelectronic semiconductor chip arranged at the top side of the carrier and having a contact area facing away from the carrier;

a reflective coating applied to exposed locations of the carrier and of the optoelectronic semiconductor chip;

an opening arranged above the connection area, the opening completely penetrating through the reflective coating and extending from a top side of the reflective coating facing away from the carrier in a direction of the top side of the carrier;

electrically conductive material arranged on the reflective coating and in the opening;

wherein the electrically conductive material electrically conductively connects the contact area to the connection area;

wherein a radiation passage area of the optoelectronic semiconductor chip is free of the reflective coating;

wherein the reflective coating does not project vertically beyond the optoelectronic semiconductor chip;

wherein the reflective coating is in direct contact with the carrier;

wherein in the opening the electrically conductive material is in direct contact with the connection area;

wherein the electrically conductive material covers at least a part of the contact area and is in direct contact with the contact area; and wherein the electrically conductive material is a contiguous layer formed from one single piece.

11. The optoelectronic semiconductor device according to claim 10, wherein the electrically conductive material only partly fills the opening, and wherein an electrically insulating filling material is arranged in the opening onto exposed locations of the electrically conductive material.

12. The optoelectronic semiconductor device according to claim 10, wherein conversion layer is arranged on the radiation passage area and onto exposed locations of the electrically conductive material;

wherein the conversion layer contains at least one luminescence conversion material; and wherein side areas of the conversion layer are free of the reflective coating.

13. A method for manufacturing an optoelectronic semiconductor device, the method comprising:

providing a carrier, which has a top side, an underside situated opposite the top side of the carrier, and a plurality of connection areas arranged at the top side alongside one another in a lateral direction;

applying a plurality of optoelectronic semiconductor chips at the top side of the carrier, the chips being arranged in a manner spaced apart from one another in the lateral direction and each having a contact area facing away from the carrier;

applying a reflective coating to exposed locations of the carrier and side areas of the optoelectronic semiconductor chips;

introducing openings into the reflective coating, the openings completely penetrating through the reflective coating and extending from a top side of the reflective coating facing away from the carrier in the direction of the top side of the carrier; and arranging electrically conductive material on the reflective coating and in the openings;

wherein the electrically conductive material in each case electrically conductively connects a contact area to the connection area assigned thereto;

wherein radiation passage areas of the optoelectronic semiconductor chips are free of the reflective coating;

wherein the reflective coating does not project vertically beyond the optoelectronic semiconductor chips;

wherein the openings are of conical design, a diameter of each opening reducing in a direction to the carrier;

wherein in the openings the electrically conductive material is in direct contact with the connection areas;

wherein in each case the electrically conductive material covers at least a part of the contact area and is in direct contact with the contact area;

wherein the electrically conductive material in each case is a contiguous layer formed from one single piece;

wherein after arranging the electrically conductive material at least in places onto at least one radiation passage area and at least in places onto exposed locations of the electrically conductive material, at least one conversion layer is applied;

wherein the conversion layer contains at least one luminescence conversion material;

wherein side areas of the conversion layer are free of the reflective coatings; and wherein the conversion layer is arranged at least in places in the openings onto exposed locations of the electrically conductive material.

* * * * *